United States Patent
Aimi et al.

[11] Patent Number: 5,237,269
[45] Date of Patent: Aug. 17, 1993

[54] CONNECTIONS BETWEEN CIRCUIT CHIPS AND A TEMPORARY CARRIER FOR USE IN BURN-IN TESTS

[75] Inventors: Bruno R. Aimi, Williston, Vt.; Ralph F. Antonucci, Newburgh, N.Y.; Ferdinand D. Dimaria, Wappingers Falls, N.Y.; Hamid R. Torabi, Essex Junction, Vt.

[73] Assignee: International Business Machines Corporation, Armonk, N.Y.

[21] Appl. No.: 676,778

[22] Filed: Mar. 27, 1991

[51] Int. Cl.⁵ .......................................... G01R 31/02
[52] U.S. Cl. ........................ 324/158 R; 324/158 F; 437/8
[58] Field of Search ............... 324/725, 158 P, 158 F, 324/158 R; 439/83, 482; 437/8; 357/70, 68, 72

[56] References Cited

U.S. PATENT DOCUMENTS

| | | | |
|---|---|---|---|
| 3,163,709 | 12/1964 | Fox | 439/83 |
| 3,243,498 | 3/1966 | Allen et al. | 439/83 |
| 3,839,727 | 10/1974 | Herdzik et al. | 357/70 |
| 4,015,328 | 4/1977 | McDonough | 439/83 |
| 4,234,666 | 11/1980 | Gursky | 357/68 |
| 4,290,079 | 9/1981 | Carpenter et al. | 357/65 |
| 4,373,778 | 2/1983 | Adham | 439/487 |
| 4,551,914 | 11/1985 | Stiggelbout | 439/83 |
| 4,635,092 | 1/1987 | Yerman et al. | 357/70 |
| 4,689,556 | 8/1987 | Cedrone | 324/158 F |
| 4,689,875 | 9/1987 | Solstad | 357/70 |
| 4,833,402 | 5/1987 | Boegh-Petersen | 324/158 P |
| 4,949,148 | 8/1990 | Bartelink | 357/72 |
| 4,975,079 | 12/1990 | Beaman et al. | 324/158 P |
| 5,001,544 | 3/1991 | Boucard | 357/70 |
| 5,002,895 | 3/1991 | LeParquier et al. | 357/70 |
| 5,048,744 | 9/1991 | Chang | 357/71 |

OTHER PUBLICATIONS

IBM Technical Disclosure Bulletin vol. 22, No. 4, Sep. 1979, "Reusable Chip Test Package", Bry et al.
IBM Technical Disclosure Bulletin, vol. 29, No. 6, Nov. 1986, "Dynamic Burn-In of Integrated Circuit Chips at the Water Level" by.
Research Disclosure, Jul. 1988, No. 291, "Improved Semi-Conductor Chip Solder Ball to Minimize Stress", 29111.
IBM Technical Disclosure Bulletin, vol. 31, No. 3, Aug. 1988 "Test and Repair of Direct Chip Attach Modules".
Research Disclosure, 30239, Jun. 1989, No. 302, "Solder Ball Reflow".

*Primary Examiner*—Ernest F. Karlsen
*Attorney, Agent, or Firm*—Floyd A. Gonzalez

[57] ABSTRACT

An apparatus for conducting burn-in tests of circuit chips in which frangible connections are made between contact points of a reusable carrier and a chip to be tested. At the end of the burn-in test, shear force is imparted such that the frangible connections are broken without causing damage to the chip or the carrier. The carrier has at least one lead line or pad made of solder wettable material such as copper for making electrical connections with solder balls of the chip. The lead line is covered with an overlay which is made of non-wettable material to which solder will not adhere. Holes are provided in the overlay such that a restricted connection may be made between the solder balls and the underlaying lead line when the solder is reflowed. At the end of the test, linear shear force is imparted such that the connections between the solder balls and the lead line are broken. The solder balls are then reflowed to reshape them for subsequent use.

13 Claims, 5 Drawing Sheets

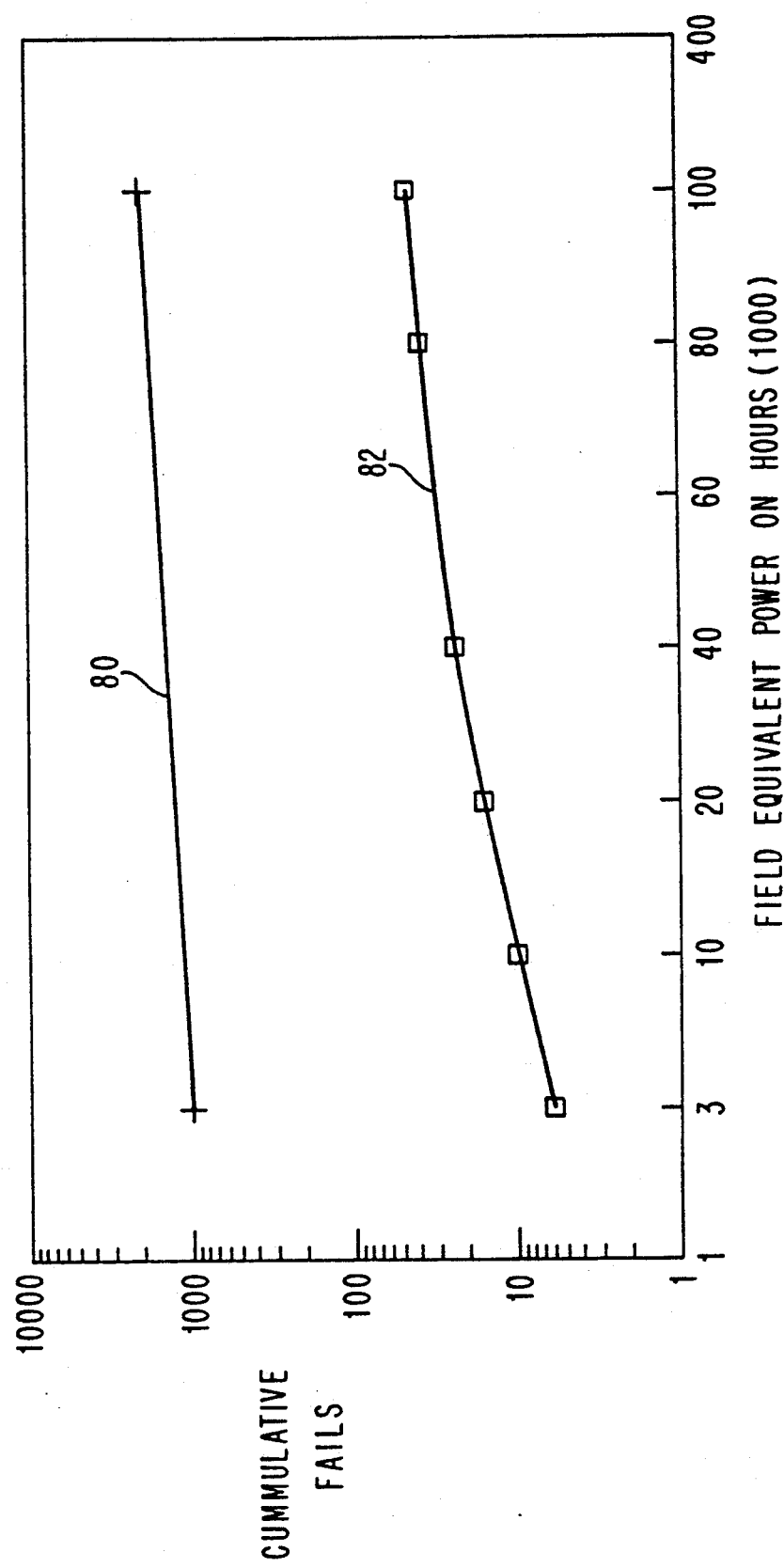

CONNECTIONS BETWEEN CIRCUIT CHIPS AND A TEMPORARY CARRIER FOR USE IN BURN-IN TESTS

BACKGROUND OF THE INVENTION

The present invention relates to a method and apparatus for use in tests of circuit chips, and more particularly relates to a method and apparatus for making connections between circuit chips and a temporary carrier for use in conducting burn-in tests of the circuit chips.

Semiconductor devices are becoming smaller and more dense with the evolution of new technology. However, increases in circuit density produce a corresponding increase in overall chip failure rates at a time when chip failure rates must decrease to remain competitive. Chip manufacturers are therefore challenged to improve the quality of their products by identifying and eliminating defects which produce defective chips known as fails. Whereas significant improvements are being made to eliminate systematic defects by reducing process variability, process improvements alone are not sufficient to eliminate all the random defects which affect both yield and reliability. Historically, screening techniques have been employed to improve product failure rates to acceptable levels by culling out many of these random defects.

The most successful of these screen types is burn-in, which has also seen significant improvement in recent years. When static burn-in was first introduced, failure rate improvement factors of 2 were typical for bipolar and early MOSFET products. Dynamic burn-in involving the application of stimuli to chip input/output pads yields a 5 to 20X improvement. It is now known that the efficiency of burn-in is limited by fails which escape detection during the burn-in process. Some chips see incomplete or no burn-in and account for many of the early fails experienced during use.

In situ burn-in was developed to overcome this deficiency. During in situ burn-in, tests are performed to ensure that the chips are experiencing proper stress, and fails which have the potential to recover are identified. In situ burn-in has been shown to improve failure rates by a factor of 30 or more. For single-chip modules, the burn-in process usually involves the insertion of the fully packaged chip into a socket on a burn-in board. For multi-chip modules (MCM's) the process is generally not as straightforward; with mixed technologies on the same MCM, the situation becomes even more complex. CMOS chips used in a multi-chip package along with bipolar chips cannot use the in situ burn-in process necessary to achieve the reliability objectives.

For high density chips, the best and most efficient way to improve the reliability failure rates is through in situ burn-in of the single chip module. Chips are placed on ceramic substrates using a solder reflow chip joining process and then are capped, tested, burned-in and shipped to the customer.

Reusable Chip Test Package, Bry et al, IBM Technical Disclosure Bulletin, Vol. 22, No. 4, Sept. 1979, discloses a test package which permits the mounting of an integrated circuit chip without the use of solder or other kind of bonding for testing prior to final encapsulation.

Dynamic Burn-In of Integrated Circuit Chips at the Wafer Level, IBM Technical Disclosure Bulletin, Vol. 29, No. 6, November 1986 discloses a burn-in test at the wafer level wherein a wafer is attached to and removed from a printed circuit board by a radiant heat source.

Improved Semiconductor Chip Solder Ball to Minimize Stress, 29111, Research Disclosure, July 1988, Number 291, discloses making a permanent connection between a chip solder ball and substrate which is personalized by a solder dam over the substrate having holes therein at a chip pad site for making connections therethrough.

Test and Repair of Direct Chip Attach Modules, IBM Technical Disclosure Bulletin, Vol. 31, No. 3, August 1988, discloses a method for removing a chip from a module where the chip tests bad or the joint between a module pad and a chip connection is bad. In the disclosed method, the chip is destroyed in the removal process, and a new chip attached.

Solder Ball Reflow, 30239, Research Disclosure, June 1989, No. 302 discloses making a permanent connection between a solder ball and a metal pad on a ceramic circuit substrate by superpositioning on the substrate, a plate fixture to which solder does not adhere. The plate has openings which restrain the solder balls so that they flatten and reach respective pads and pins during reflow.

U.S. Pat. No. 4,975,079 for Connector Assembly for Chip Testing, issued Dec. 4, 1990 to Beaman et al, discloses an electrical connector having contact members and urging means for making electrical contact with convex deformable contact areas on an electric device during a test.

SUMMARY OF THE INVENTION

In the present invention, a circuit chip to be tested is attached to a temporary, sacrificial carrier to perform burn-in and test steps of a chip fabrication process. The attachment technique allows the circuit chip to be sheared off the ceramic substrate of the temporary carrier with no damage to the chip or the carrier such that the carrier may be reused. The connection between solder balls of the chip and lead lines or pads of solder wettable material such as copper on the ceramic substrate is made by placing the chips on the carrier and heating in a chip joining or reflow furnace to reflow the solder. The lead line or pad is covered by an overlay of non-wettable material such as chrome to which solder will not adhere. The overlay has an opening through which solder flows to make a restricted joint between the solder ball and the copper lead line. After burn-in, these restricted joints are sheared off without causing damage to the chips or carrier. A high temperature hydrogen reflow process is then used to re-shape the solder balls to their original form. The chips are visually inspected for any physical damage prior to shipment.

The attachment technique of the present invention results in an electrically reliable joint which is strong enough to hold the chip in position on a carrier throughout the burn-in and test procedures, but which is weak enough to be sheared-off without causing damage to either the chip or the carrier. The attachment technique of the present invention is very inexpensive compared to the prior known techniques which required expensive complicated mechanical connectors or probes for forming less reliable pressure contacts.

It is therefore an object of the present invention to provide a circuit chip test apparatus including a temporary chip carrier having contact points for making contact with a chip to be tested, a contact restricting layer on the temporary chip carrier for controlling the area of solid bond between the chip and the contact points, and bonding material for bonding the chip to be tested to the carrier at the contact points such that the area of the bond is restricted by the contact restricting layer for removing the circuit chip from the temporary chip carrier after the test without causing damage.

It is a further object of the present invention to provide a method of connecting a circuit chip to a temporary chip carrier including making contact between a chip to be tested and a temporary chip carrier at contact points, restricting the area of solid bond between the chip at the contact points and bonding the chip to be tested to the temporary chip carrier at the contact points such that the area of bonding is restricted for providing removal of the circuit chip from the temporary chip carrier after the test without causing damage.

The foregoing and other objects, features and advantages of the invention will be apparent from the following more particular description of the preferred embodiment of the invention as illustrated in the drawings.

BRIEF DESCRIPTION OF THE DRAWINGS

FIG. 8 is a graph showing failure rate improvements due to the burn-in test step of the process of FIG. 1.

DESCRIPTION OF THE PREFERRED EMBODIMENT

Figure 1:
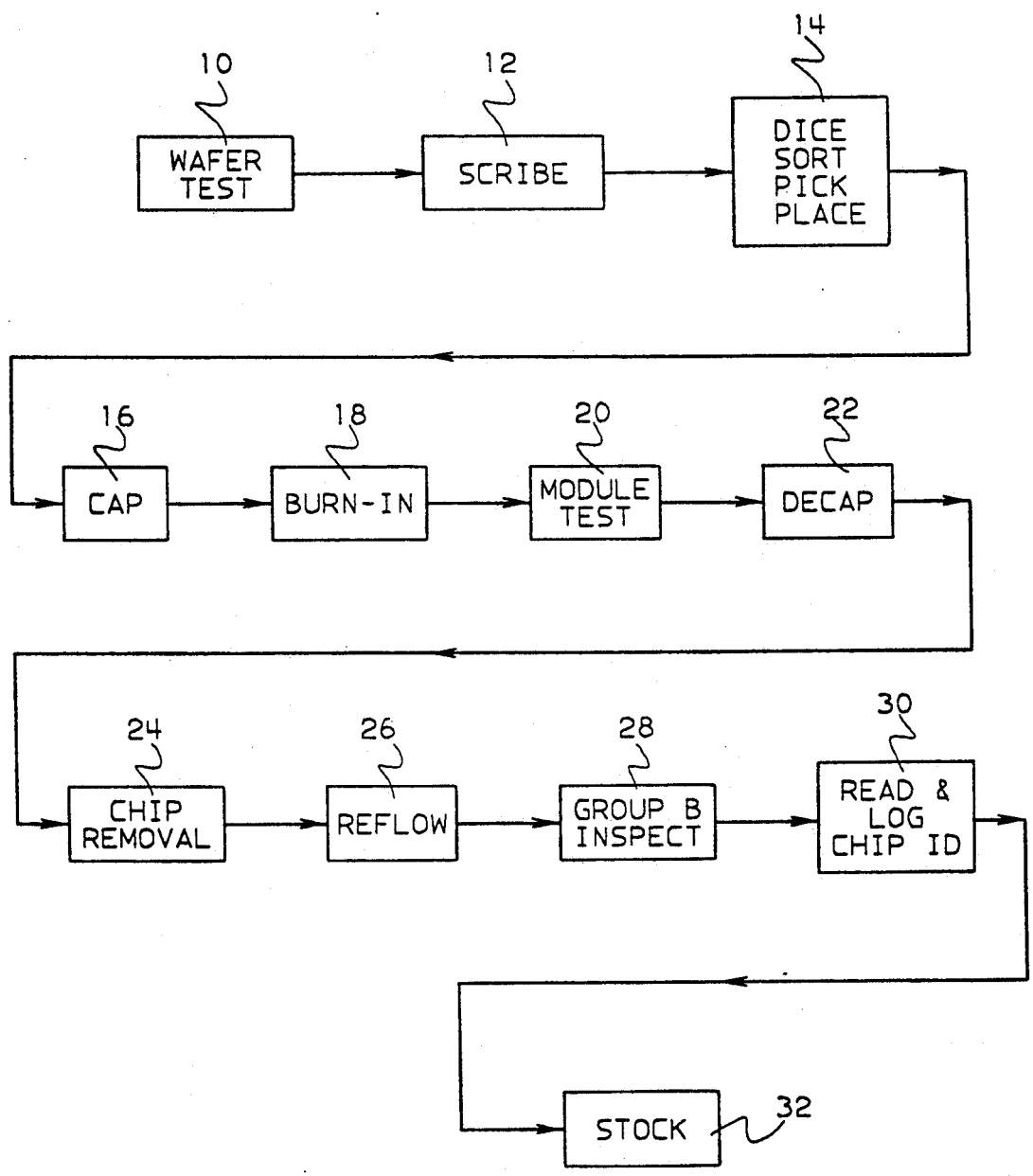
FIG. 1 illustrates a process flow in the fabrication of chips using the present invention.

FIG. 1 is an illustration of a process flow from wafer test 10 to stock 32 in the fabrication of chips using the present invention. Block 10 of FIG. 1 shows wafer test wherein the functionality of the wafer is tested to separate good chips from bad chips at this point. Block 12 shows a scribe step wherein the back of each chip on the wafer is scribed by a laser with an identification for identifying individual chips in the wafer. Block 14 of FIG. 1 illustrates the dice, sort, and pick-and-place steps of the process of FIG. 1. In the dice step, the wafer is broken up into individual chips. In the sort step, the individual chips are sorted into bad, good and partially good chips as determined in the wafer test 10.

In the pick and place step of 14, the individual chips are mounted on a temporary or sacrificial carrier in a chip joining or reflow furnace, as will be described. At block 16, a dry cap is mounted on each chip to provide protection to the chip during the burn-in and module test, to be described. After the chips are capped in cap step 16, the chips are placed in burn-in boards, which are in turn placed in a burn-in tool to conduct testing and stressing in the burn-in step 18 of the process of FIG. 1. After the burn-in test of 18, the chips are removed from the burn-in board, and those which passed the burn-in test are individually tested in the module test step 20.

In the burn-in test 18, the chips are stressed by applying high voltage and high temperature, and are exercised to screen out fails, as previously described. In the module test 20, each chip is individually tested by system simulation to ensure that chips which are shipped to a customer meet system requirements. Both the burn-in test and the module test are well understood by those skilled in the art, do not form a part of the present invention, and will not be discussed further. At 22, those chips which have passed both the burn-in test at 18 and the module test at 20 are decapped by removing the dry cap added at 16, and are advanced to the chip removal step at 24 wherein the chips are removed from the temporary carrier. During chip removal at 24, the individual chips are placed in a chip boat, which is placed in a reflow furnace at 22 reshape the solder balls to their original form, as will be discussed. At 28, the chips are given a visual inspection to screen out any chips which have any sign of mechanical damage. At 30, the identification information added at scribe step 12 is read and added into a data log system for traceability purposes. The chips are now complete and are added to the stock at 32 for shipment to customers.

Figure 2:
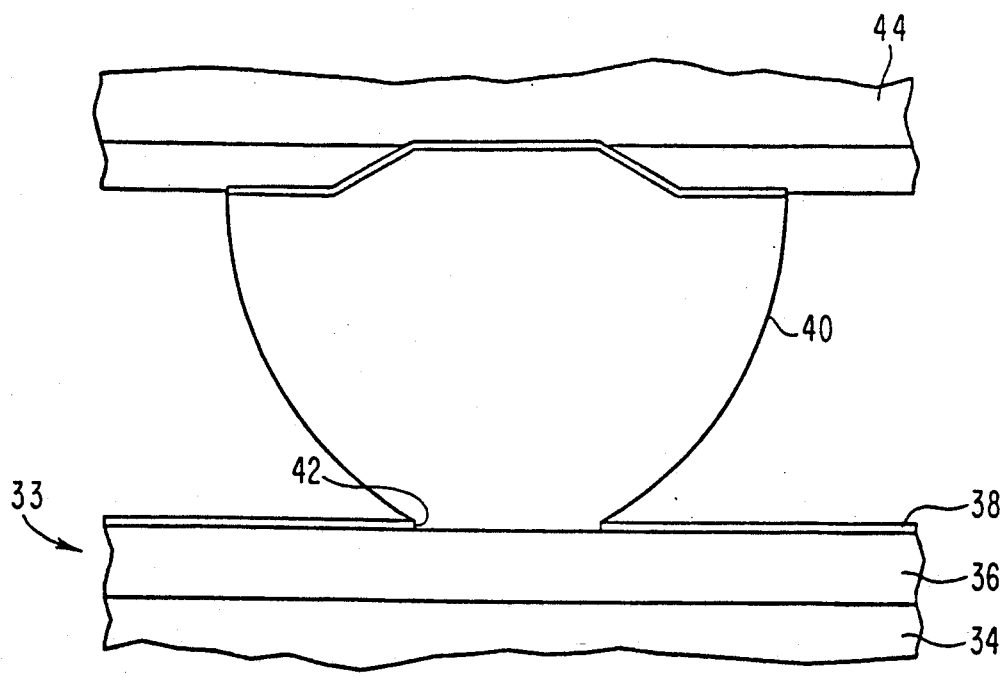
FIG. 2 shows one connection between a solder ball of a chip to be tested and a contact point of a removable chip carrier which is formed in a pick and place step of the process of FIG. 1.

FIG. 2 is an illustration which shows one connection between a solder ball 40 of a chip 44 to be tested and a contact point of a removable chip carrier 33. This connection is made at the pick and place step of 14, as previously described. The temporary carrier 33 includes a ceramic substrate 34 onto which is deposited a lead line 36 of solder wettable material such as copper for forming a contact point. An overlay 38 is deposited over the lead line 36 for limiting the area of connection between the lead line 36 and solder ball 40, as will be described.

The overlay layer 38 is formed of a non-wettable material such as chrome to which the solder of the solder ball 40 will not adhere. The overlay layer 38 includes a hole 42 which is designed to restrict the area of connection between the lead line 36 and the solder ball 40 by reducing the radius of the circle of contact between the solder ball 40 and the lead line 36 at their point of contact. It will be understood that the solder ball 40 provides the electrical connections to the circuits of the chip 44.

Figure 3:
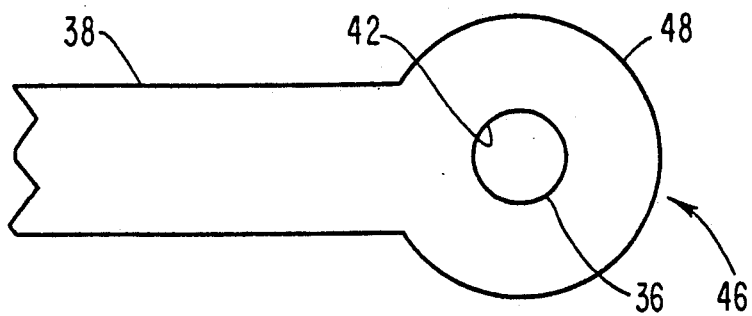
FIG. 3 shows, a finger design of the contact point of the removable chip carrier of FIG. 2.

FIG. 3 is an illustration of the design of a finger 46 of the removable chip carrier 33. As described in connection with FIG. 2, the finger 46 includes a lead line 36 overlayed with the non-wettable layer 38. The layer 38 has a hole 42 therethrough which exposes the surface of the lead line 36 to a solder ball placed thereon. The finger 46 includes an enlarged portion which may, in one embodiment, have a diameter of 6 mils. The opening 42 typically has a diameter of 1.8 mils plus or minus 0.6 mils for use with solder balls 40 having diameters in excess of about 4 mils. However, the opening 42 maybe as small as about 0.8 mils. It has been known that a connection with the described opening 42 may be broken by applying a shear force of approximately 6 grams, which shear force is not sufficient to cause damage to either the chip 44 or the temporary carrier 33. It has further been found that the shear force necessary to break a connection is related to the area provided by the opening 42. For instance, an opening having a diameter of about 6.2 mils provides for a breaking shear force of about 67 grams.

Figure 4:
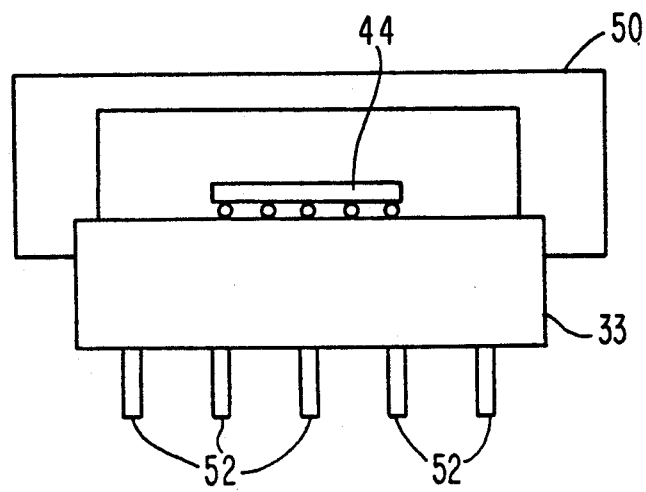
FIG. 4 is an illustration of a dry cap added to the chip to be tested in a cap step of the process of FIG. 1.

FIG. 4 is an illustration of a dry cap 50 which is placed over the chip 44 connected to the temporary carrier 33 in the cap step 16 of FIG. 1 as previously described. The dry cap 50 provides protection for the chip 44, and additionally is marked with identification for use during the burn-in step 18 and the module test step 20 of FIG. 1. FIG. 4 further shows pin connections 52 on the temporary carrier 33 which have internal connectors to provide power and electrical signals to the lead line 36 for exercising the chip 44, as is well understood in the art.

Figure 5:
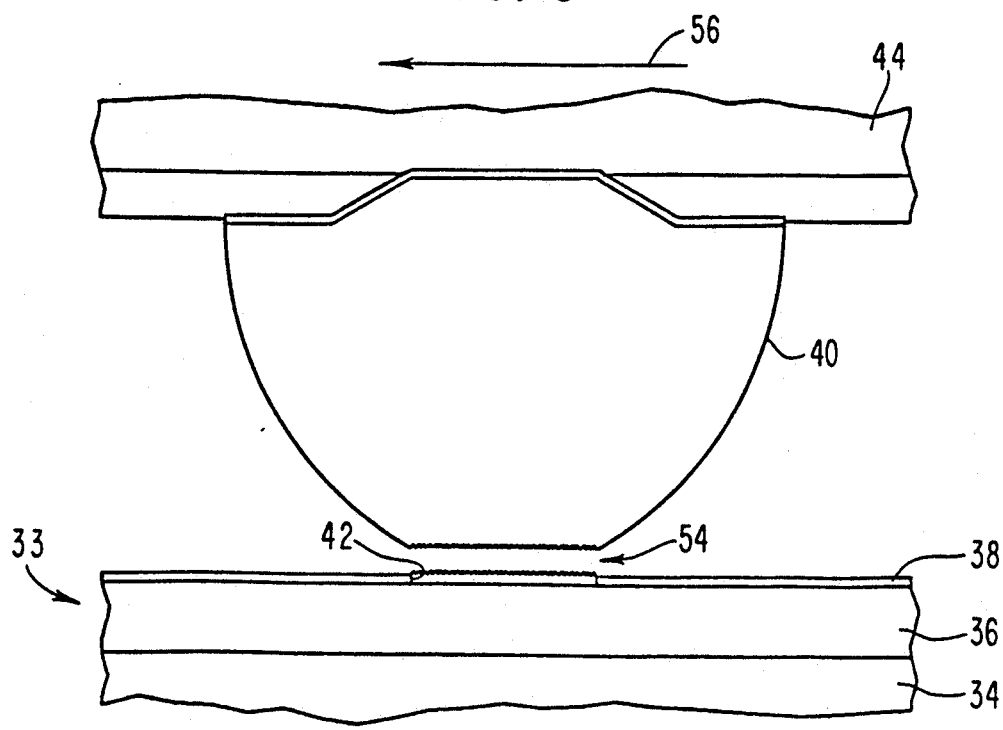
FIG. 5 illustrates the breaking of the connection of FIG. 2 in a chip removal step of the process of FIG. 1.

FIG. 5 is an illustration of the breaking of the connection between the solder ball 40 and the lead line 36 which is performed in the chip removal step 24 of FIG. 1. Shown at 54, the limited area connection caused by the overlay layer is broken by applying linear shear, illustrated at 56. It will be understood that in the present embodiment, torsional forces may also be used to break the connection at 54 in addition to or in place of the linear shear force 56. In its first use, a small amount of residual solder will remain in the hole 42, however the amount is sufficiently small that when the solder ball 40 is reformed in the reflow step 26 the solder ball 40 returns to its original shape, virtually unaffected.

Figure 6:
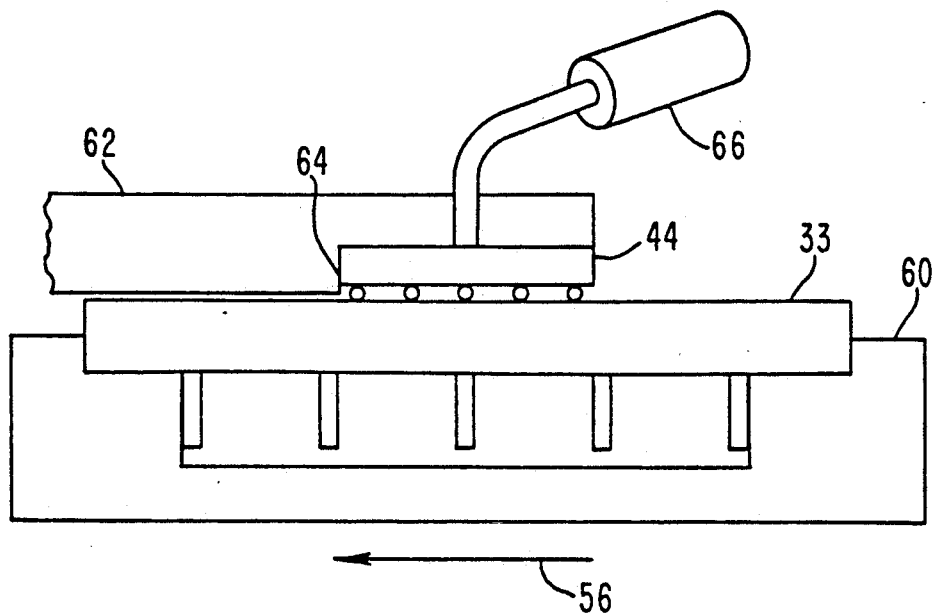
FIG. 6 is an illustration of a mechanism for removing a chip from a removable chip carrier.
Figure 7:
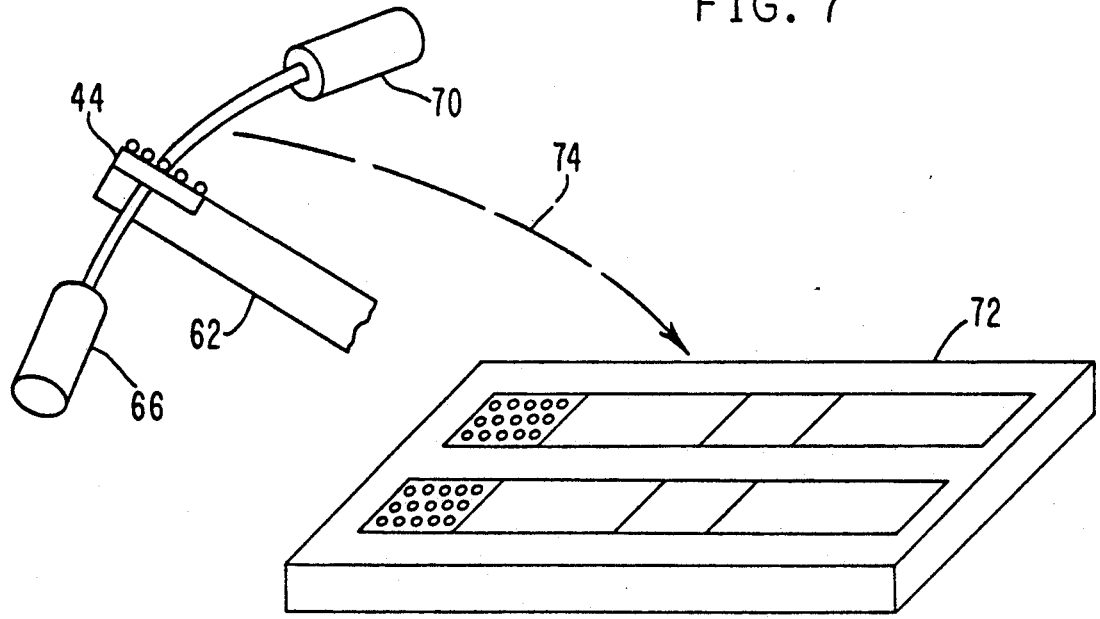
FIG. 7 is another view of the mechanism of FIG. 6 wherein a chip that has been removed in the chip removal step is placed in a chip boat for use in the reflow step of FIG. 1.

FIG. 6 is an illustration of a mechanism for removing the chip 44 from the removable chip carrier 33 during the chip removal step 24 of FIG. 1. The chip carrier 33 is trapped in a cavity of a module holder 60, and while the chip 44 is held in position by an arm 62, the module holder 60 is translated by the application of linear shear force 56 such that the connections between the chip 44 and the carrier 33 are broken by the action of edge 64 of the arm 62 against one side of the chip 44. A vacuum pencil 66 provides a holding force for holding the chip 44 against the arm 62 as the arm is raised to a second position. FIG. 7 is another view of the chip removal mechanism of FIG. 6 wherein the arm 62 has been raised to the mentioned second position. In the second raised position of arm 62, a second vacuum pencil 70 is used to remove the chip 44 from its cavity in the arm 62 to a chip boat 72 as shown by dotted line 74. It will be understood that the chip 44 is placed in the chip boat 72 with its solder balls in the up position so that the solder balls may be reformed properly in the reflow step 26. Once it is filled, the chip boat 72 is placed in a reflow furnace to reshape the solder balls, as previously described.

FIG. 8 is a graph showing the failure rate improvement due to the burn-in test step 18 and module test step 20 of FIG. 1. FIG. 8 is a graph of the cumulative failures in chips as experienced after field equivalent power on hours. The line 80 represents the failures experienced without the burn-in and module tests 18 and 20, while the line 82 represents the failures experienced after the process of FIG. 1.

While we have illustrated and described a preferred embodiment of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. A circuit chip test apparatus comprising:
   a carrier having contact points for making contact with a chip to be tested;
   contact restricting means for controlling the area of solid bond between the chip and said contact points to an area less than the area used to make permanent bonds at said contact points;
   bond means for bonding the chip to be tested to said carrier at said contact points during a test, the area of said solid bonding being restricted by said contact restricting means for limiting the force required to break the solid bond between said carrier and the circuit chip formed by said bond means; and
   removing means for breaking the bond formed by said bond means for removing the chip from said carrier after the test.

2. The apparatus of claim 1 wherein said contact restricting means is made of non-wettable material to which said bond means does not adhere.

3. The apparatus of claim 2 wherein said bond means comprises solder balls on the chip such that, when reflowed, the solder therefrom adheres to said contact points.

4. The apparatus of claim 1 wherein said removing means comprises:
   restraining means for restraining the chip and said carrier after said test; and
   force imparting means for imparting shear force between the chip and said carrier to break the bond formed by said bond means.

5. The apparatus of claim 4 wherein said restraining means comprises a module holder having a cavity for trapping said carrier therein, and an arm having an edge engageable along at least one side of the chip.

6. The apparatus of claim 5 wherein said force imparting means imparts linear shear force by moving said module holder with said carrier trapped therein such that the chip is engaged with the edge of said arm, thereby causing the connections between the chip and said carrier to be broken.

7. A reusable chip carrier for use in chip testing, said chip carrier comprising:
   a carrier substrate;
   at least one carrier contact of solder wettable material on the surface of said carrier substrate for making electrical connection to a chip to be tested;
   an overlay over said carrier contact, said overlay having a restricting means for restricting the bonding of a solid connection between said underlaying carrier contact and a chip contact on the chip to be tested, the area of the solid connection provided by said restricting means being less than the area used to make permanent bonds such that the force needed to separate the bond between the carrier contact and the chip contact is reduced to a desired value when the chip is separated from the chip carrier after the test.

8. The reusable chip carrier of claim 7 wherein said overlay is made of a material non-wettable to solder.

9. The reusable chip carrier of claim 8 wherein said overlay is made of chrome.

10. The reusable chip carrier of claim 7 wherein said restricting means includes a hole through said overlay such that contact can be made with the underlaying carrier contact.

11. The reusable chip carrier of claim 10 wherein said hole has a diameter of from about 0.8 mils to about 2.4 mils for restricting contact between said copper lead line and a solder ball having a diameter of about 4 mils or greater.

12. A method for testing a circuit chip comprising the steps of:

placing a chip to be tested on a temporary substrate, said chip having at least one solder ball between a carrier contact on said temporary substrate and a chip contact on said chip;

heating said chip and said temporary substrate to reflow said solder ball;

restricting solder flow between said carrier contact and said chip contact to an area less than the area used to make a permanent bond by means of an overlay between said solder ball and said carrier contact, said overlay being made of a material which is non-wettable to solder;

cooling said chip and said temporary substrate to solidify a restricted solid solder connection between said temporary carrier and said chip;

conducting a burn-in test of said chip; and applying force between said chip and said temporary substrate to break said restricted solid solder connection for separating said chip from said temporary carrier.

13. The method of claim 12 further comprising the step of heating said chip after its separation from said temporary substrate for reflowing said solder ball thereby reshaping said solder ball for subsequent use.

* * * * *